(12) United States Patent
Brun et al.

(10) Patent No.: US 11,804,470 B2
(45) Date of Patent: Oct. 31, 2023

(54) WAFER LEVEL PASSIVE HEAT SPREADER INTERPOSER TO ENABLE IMPROVED THERMAL SOLUTION FOR STACKED DIES IN MULTI-CHIPS PACKAGE AND WARPAGE CONTROL

(71) Applicant: Intel Corporation, Santa Clara, CA (US)

(72) Inventors: Xavier F. Brun, Chandler, AZ (US); Kaizad Mistry, Lake Oswego, OR (US); Paul R. Start, Chandler, AZ (US); Nisha Ananthakrishnan, Chandler, AZ (US); Yawei Liang, Chandler, AZ (US); Jigneshkumar P. Patel, Chandler, AZ (US); Sairam Agraharam, Chandler, AZ (US); Liwei Wang, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 921 days.

(21) Appl. No.: 16/548,255

(22) Filed: Aug. 22, 2019

(65) Prior Publication Data

US 2021/0057381 A1    Feb. 25, 2021

(51) Int. Cl.
*H01L 25/065* (2023.01)
*H01L 25/00* (2006.01)
(Continued)

(52) U.S. Cl.
CPC ........ *H01L 25/0655* (2013.01); *H01L 21/561* (2013.01); *H01L 23/291* (2013.01);
(Continued)

(58) Field of Classification Search
CPC . H01L 25/0655; H01L 21/561; H01L 23/291; H01L 23/3135; H01L 23/3675;
(Continued)

(56) References Cited

U.S. PATENT DOCUMENTS

2017/0018510 A1*  1/2017  Shen ................... H01L 23/3128
2019/0326192 A1* 10/2019  Eid ..................... H01L 23/3675
(Continued)

*Primary Examiner* — Victor A Mandala
(74) *Attorney, Agent, or Firm* — Schwabe, Williamson & Wyatt, P.C.

(57) ABSTRACT

Embodiments include semiconductor packages and methods to form the semiconductor packages. A semiconductor package includes a plurality of first dies on a substrate, an encapsulation layer over the first dies and the substrate, an interface layer over the first dies and the encapsulation layer, and a passive heat spreader on the interface layer, wherein the interface layer thermally couples the first dies to the passive heat spreader. The passive heat spreader includes a silicon (Si) or a silicon carbide (SiC). The interface layer includes a silicon nitride (SiN) material, a silicon monoxide (SiO) material, a silicon carbon nitride (SiCN) material, or a thermal adhesive material. The semiconductor package may include a plurality of second dies and the substrate on a package substrate, a thermal interface material (TIM) over the second dies, the passive heat spreader, and the package substrate, and a heat spreader over the TIM and the package substrate.

20 Claims, 5 Drawing Sheets

(51) Int. Cl.
| | |
|---|---|
| *H01L 23/367* | (2006.01) |
| *H01L 23/29* | (2006.01) |
| *H01L 23/31* | (2006.01) |
| *H01L 23/00* | (2006.01) |
| *H01L 25/18* | (2023.01) |
| *H01L 23/48* | (2006.01) |
| *H01L 21/56* | (2006.01) |

(52) U.S. Cl.
CPC ...... *H01L 23/3135* (2013.01); *H01L 23/3675* (2013.01); *H01L 24/16* (2013.01); *H01L 24/29* (2013.01); *H01L 24/32* (2013.01); *H01L 24/73* (2013.01); *H01L 25/18* (2013.01); *H01L 25/50* (2013.01); *H01L 23/481* (2013.01); *H01L 2224/16145* (2013.01); *H01L 2224/29186* (2013.01); *H01L 2224/32145* (2013.01); *H01L 2224/73253* (2013.01)

(58) Field of Classification Search
CPC ......... H01L 24/16; H01L 24/29; H01L 24/32; H01L 24/73; H01L 25/18; H01L 25/50; H01L 23/481; H01L 2224/16145; H01L 2224/29186; H01L 2224/32145; H01L 2224/73253; H01L 2224/16; H01L 2224/73204; H01L 2224/92125; H01L 2224/97; H01L 2924/15313; H01L 2924/18161; H01L 2924/3511; H01L 23/053; H01L 23/24; H01L 23/36; H01L 23/3731; H01L 23/42; H01L 21/563; H01L 24/12; H01L 23/562; H01L 2224/81; H01L 2224/83; H01L 2924/00
See application file for complete search history.

(56) References Cited

U.S. PATENT DOCUMENTS

| | | | |
|---|---|---|---|
| 2020/0051894 A1* | 2/2020 | Wan | H01L 23/427 |
| 2020/0058632 A1* | 2/2020 | Chen | H01L 23/3128 |
| 2020/0365486 A1* | 11/2020 | Huang | H01L 21/56 |
| 2021/0035859 A1* | 2/2021 | Mehta | H01L 21/76804 |
| 2021/0035880 A1* | 2/2021 | Goh | H01L 21/4871 |
| 2021/0035881 A1* | 2/2021 | Mallik | H01L 25/0655 |
| 2021/0041182 A1* | 2/2021 | Eid | F28D 15/046 |
| 2021/0043541 A1* | 2/2021 | Eid | H01L 23/3128 |
| 2021/0043543 A1* | 2/2021 | Eid | H01L 23/427 |
| 2021/0043544 A1* | 2/2021 | Eid | H03H 9/0542 |
| 2021/0043573 A1* | 2/2021 | Eid | H01L 25/18 |
| 2022/0262697 A1* | 8/2022 | Fang | H01L 23/562 |

* cited by examiner

WAFER LEVEL PASSIVE HEAT SPREADER INTERPOSER TO ENABLE IMPROVED THERMAL SOLUTION FOR STACKED DIES IN MULTI-CHIPS PACKAGE AND WARPAGE CONTROL

FIELD

Embodiments relate to packaging semiconductor devices. More particularly, the embodiments relate to semiconductor devices with wafer level passive heat spreader interposers that enable improved thermal solution for stacked dies in multi-chip package and warpage control.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor devices. The drive to scale-down features in ICs such as with multi-chip packages (MCPs), while optimizing the performance of each device, however is not without issue.

In MCPs, where multiple single dies or stacked dies are assembled onto a single package, existing packaging technologies have encountered several problems attempting to implement a single thermal solution, with the same thermal interface materials (TIMs) and corresponding interfaces, due to the differences in height of the multiple or stacked dies. For example, existing packaging solutions typically need to compromise and implement multiple thermal solutions, including different TIMs, when MCPs require stacking thin dies, such as embedded interconnecting bridge dies, with thicker dies, such as high-bandwidth memory (HBM) dies. As a result of these compromises, these MCPs generally include several added complexities, compatibility issues, and/or reduced (or substantially less than optimal) device/product performances, such as decreased thermal efficiencies/capabilities, increased mold impact on the overall thermals, mechanical issues such as increased warpage, and incapability of assembling MCPs with varying die thicknesses at package level with a single thermal solution.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Figure 1:
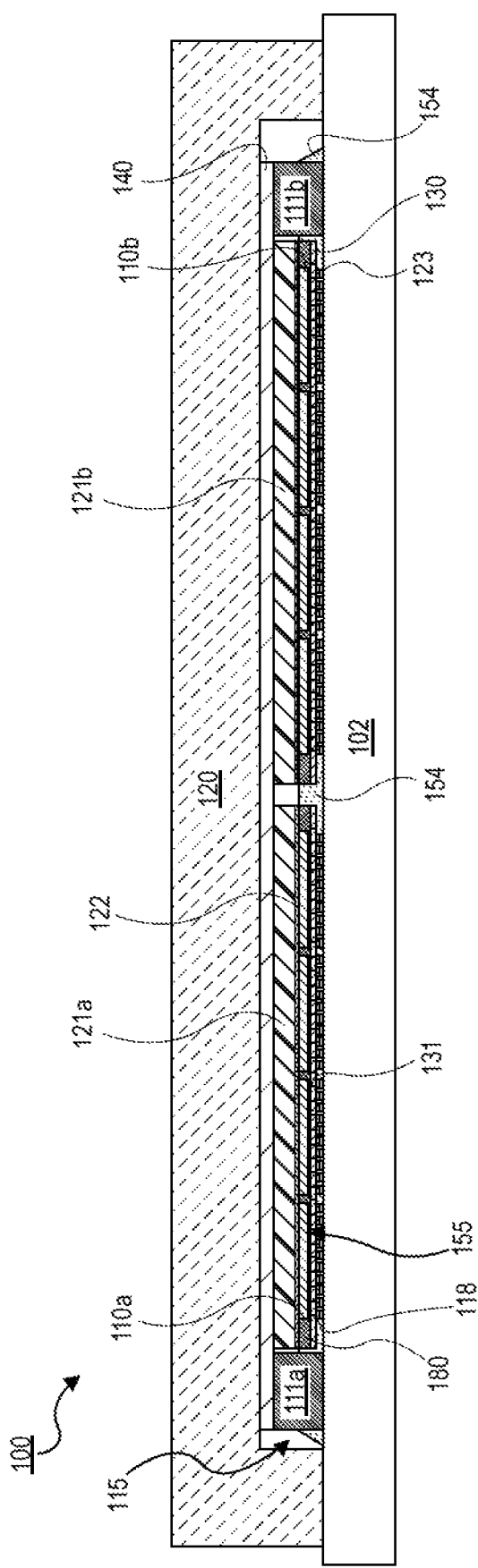
FIG. 1 is an illustration of a cross-sectional view of a semiconductor package with a heat spreader, a thermal interface material (TIM), a plurality of passive heat spreaders, a plurality of first dies, a plurality of second dies, a plurality of substrates, and a package substrate, according to one embodiment.

Described herein are semiconductor packages with heat spreader passive interposers and methods of forming such semiconductor packages. The semiconductor packages described below and methods of forming such semiconductor packages include a heat spreader, a thermal interface material (TIM), a plurality of first dies, a plurality of second dies, a plurality of substrates, and a package substrate, according to some embodiments. The embodiments described herein enable a multi-chip package (MCP) (or a semiconductor package) to dispose/attach a heat spreader passive interposer on/over a stacked wafer of dies, thereby simplifying the thermal solution of the MCP by controlling the thickness (or thicknesses) of the heat spreader passive interposer, according to one embodiment.

The embodiments described herein provide improvements to existing packaging solutions by enabling a single thermal solution to be implemented for MCPs, which may include stacked dies (or a stack of core dies), memory dies (e.g., high-bandwidth memory (HBM) dies), and/or any other external peripheral dies within the same MCP, by ensuring the same thickness (or thicknesses). These embodiments help existing packaging solutions by allowing the semiconductor package to mix various types of dies on a single package substrate with a single thermal solution such as a solder TIM (STIM) with a backside metallization metal (BSM) on all of the dies under the heat spreader (or an integrated heat spreader (IHS)), thereby also successfully enabling a roadmap for assembling disaggregated and heterogeneous packages.

Additionally, in these embodiments, enabling STIM-based overall thermal solutions on entire semiconductor packages, such as MCPs, provides a substantial improvement in the overall thermal dissipation of such package. For example, in the air-cooled solution space, the presence or lack of this thermal improvement can make or break the product design and feasibility. Furthermore, the embodiments described herein may further improve the thermal efficiency and capabilities of the semiconductor package by combining the STIM-based overall thermal solutions and the BSM on/over the neighboring dies.

These embodiments also improve packaging solutions by simplifying existing through silicon via (TSV) reveal process, and significantly reducing warpage issues. For example, the current TSV reveal process has some non-value added steps that may be required such as temporary bonding and debonding steps. Due to the thermal properties of the temporary adhesive (or thermoplastic) of the current TSV reveal process, such steps are constrained thermally and induce significant via reveal challenges due to the thickness variation(s) of the adhesive. As such, the embodiments described below enable eliminating the temporary carrier process—and thus the temporary bonding and debonding steps—with the use of the permanent heat spreader passive interposer that may be implemented in mid-process of the TSV reveal process.

Lastly, these embodiments described herein also improve packaging solutions by enabling a lower stack warpage at elevated temperature. This lower stack warpage may be implemented with the semiconductor package by balancing material(s) with similar coefficient of thermal expansion (CTE), and substantially minimizing the impact of the encapsulation material (or mold materials). In addition, these embodiments substantially simplify the BSM integration with a monolithic polished surface at full thickness as compared to the existing BSM integration on the exposed die mold interface which encounters issues/concerns with the adhesive film to mold adhesion, and with the mold moisture impact to the BSM.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, interne devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages with passive heat spreaders, interface layers, TIMs, first dies, second dies, substrates, and package substrates.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Referring now to FIG. 1, a cross-sectional illustration of a semiconductor package 100 is shown, in accordance with an embodiment. In an embodiment, the semiconductor package 100 may include a heat spreader 120, a TIM 140, a plurality of passive heat spreaders 121a-b, a plurality of first dies 110a-b, a plurality of second dies 111a-b, a plurality of substrates 130, and a package substrate 102, according to one embodiment. For one embodiment, the semiconductor package 100 may be a MCP or the like.

In one embodiment, a plurality of substrates 130 may be disposed over a package substrate 102. For one embodiment, the package substrate 102 may include, but is not limited to, a package, a substrate, a printed circuit board (PCB), and/or a motherboard. For one embodiment, the package substrate 102 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer may be a photosensitive dielectric layer. For one embodiment, the PCB 102 may include a plurality of conductive layers, which may further include copper (or metallic) traces, lines, pads, vias, via pads, holes, and/or planes.

As shown in FIG. 1, the substrates 130 may be disposed over the package substrate 102, where the substrates 130 may be conductively coupled to the package substrate 102 with a plurality of solder balls 123. Note that, while two substrates 130 are shown in FIG. 1, it is to be appreciated that any number of substrates 130 may be disposed on/over and coupled to the package substrate 102 (e.g., one substrate 130 may be implemented with a larger footprint (or an x-y area) to couple the package substrate 102 to the first dies 110a-b).

In one embodiment, the substrates 130 may be a high-density organic substrate such as a high-density package (HDP) substrate or the like. For one embodiment, the substrates 130 may include a plurality of redistribution layers (RDLs) comprised of traces with L/S of approximately or less than 2/2 um (i.e., fine/ultrafine traces), lithographically-defined vias, zero-misalignment vias, and/or via pads with fine (or ultrafine) pitches. The substrates 130 may be a silicon substrate having increased (or high) input/output (I/O) density and bandwidth for the communication between the first dies 110a-b and the package substrate 102. In one embodiment, the substrates 130 may have a thickness of approximately 10 um to 200 um, or, in an alternative embodiment, a thickness of approximately or less than 10 um.

In one embodiment, the substrates 130 may have a plurality of conductive pads 118 and a plurality of conductive interconnects 131. The conductive pads 118 may be disposed on the bottom surfaces of the substrates 130. The conductive pads 118 may be a plurality of ball-grid array (BGA) pads or the like. The conductive interconnects 131 of the substrates 130 may include conductive vias, traces, lines, pads, or the like. For example, the conductive interconnects 131 may be directly coupled to the conductive pads 118, where the solder balls 123 may conductively couple the first conductive pads 118 of the substrates 130 to the top surface of the package substrate 102. As such, in some embodiments, the conductive interconnects 131 of the substrates 130 may communicatively couple the package substrate 102 to a plurality of first dies 110a-b.

The first dies 110a-b may be disposed over the respective substrates 130, where the first dies 110a are positioned on the top surface of one of the substrates 130, and the first dies 110b are positioned on the top surface of another of the substrates 130. For one embodiment, the first dies 110a-b may be a thin die such as a composite die stack, a monolithic silicon die, and/or any other thin die (e.g., a thin embedded multi-die interconnect bridge (EMIB)). For one embodiment, the first dies 110a may have a thickness (or z-height) that is substantially equal to a thickness of the first dies 110b. In some embodiments, the first dies 110a-b may include, but are not limited to, a semiconductor die, an electronic device (e.g., a wireless device), an integrated circuit (IC), a central processing unit (CPU), a microprocessor, a platform controller hub (PCH), a memory, and/or a field-programmable gate array (FPGA). The first dies 110a-b may have a thin profile (or a low z-height profile), be formed from a material such as silicon (or the like), and have circuitry thereon that is to be coupled to the substrates 130 and/or any other dies, substrates, and so on.

In some embodiments, an encapsulation layer 180 may be disposed over the first dies 110a-b and the substrates 130. In one embodiment, the encapsulation layer 180 may include one or more encapsulation materials such as a mold material, an underfill material, a filler material, any similar material(s), and/or any combination thereof. For one embodiment, the encapsulation layer 180 may include an epoxy (e.g., a soft epoxy, a stiff epoxy, opaque epoxy, etc.) with one or more filler materials. In an embodiment, the encapsulation layer 180 may be compression molded, laminated, or the like. For example, the encapsulation layer 180 may be planarized as the top surface of the encapsulation layer 180 may be substantially coplanar to the top surfaces of the first dies 110a-b, where the encapsulation layer 180 may also be disposed between the outer edges of the first dies 110a-b.

Also, the encapsulation layer 180 may be disposed over an underfill material 155 (or an underfill layer). In one embodiment, the underfill material 155 may be disposed over the substrates 130, where the underfill material 155 is disposed between the top surface of the substrates 130 and the bottom surfaces of the first dies 110a-b. The underfill material 155 may be surrounded (or embedded) with portions of the encapsulation layer 180. In some embodiments, the underfill material 155 may surround conductive pads and solder balls (or solder bumps) formed between the first dies 110a-b and the respective substrates 130 (e.g., as shown with the underfill material 255 of FIG. 2B).

In some embodiments, a plurality of passive heat spreaders 121a-b (also referred to as passive heat spreader interposers) may be disposed over the top surfaces of the first dies 110a-b and the encapsulation layer 180. The passive heat spreader 121a may be disposed over the first dies 110a, while the passive heat spreader 121b may be dispose over the first dies 110b. In one embodiment, each of the passive heat spreaders 121a-b may have a width that is greater than the combined widths of the respective first dies 110a-b. For one embodiment, the passive heat spreaders 121a-b may have a width that is substantially equal to a width of the substrates 130. In alternate embodiments, the passive heat spreaders 121a-b may have a width that is different from a width of the substrates 130. Note that, while two passive heat spreaders 121a-b are shown in FIG. 1, it is to be appreciated that any number of passive heat spreaders 121a-b may be disposed on/over and coupled onto the first dies 111a-b.

For one embodiment, each of the passive heat spreaders 121a-b may be, but is not limited to, a passive heat spreader interposer, an interposer, and/or a stiffener. For some embodiments, the passive heat spreaders 121a-b may be formed of one or more different substrate/interposer materials, such as silicon (Si), silicon carbide (SiC), or the like, for improved thermal conductivity. For example, the passive heat spreaders 121a-b may provide improved warpage control by implementing similar CTE materials for both of the stacked passive heat spreaders 121a-b and first dies 110a-b. In one embodiment, the passive heat spreaders 121a-b may be directly bonded (or attached/coupled) to the encapsulation layer 180 and the respective first dies 110a-b with an interface layer 122. For example, the passive heat spreaders 121a-b may be directly (or permanently) coupled/attached to the respective first dies 110a-b at the wafer level. For one embodiment, the passive heat spreaders 121a-b may be attached permanently at the wafer level by directly bonding (or leveraging) the interface layer 122 to the Si/SiC materials of the passive heat spreaders 121a-b that do not require any alignment features.

In one embodiment, the interface layer 122 may include a silicon nitride (SiN) material, a silicon monoxide (SiO) material, a silicon carbon nitride (SiCN) material, and/or a thermal adhesive material (e.g., alumina, silver, or the like). For some embodiments, the interface layer 122 may be a SiN/SiO/SiCN layer or a thermal adhesive layer (as described in further detail below in FIG. 2D). For example, the interface layer 122 may create a permanent bond interface between the first dies 110a-b and the passive heat spreaders 121a-b when the interface layer 122 includes the SiN/SiO/SiCN materials. In these embodiments, stacking the passive heat spreaders 121a-b and the interface layers 122 allows for improved (or enhanced) thermal performance to extract (or dissipate) heat from the respective first dies 110a-b (or the base dies) due to (i) the reduction of needed thickness of the encapsulation layer 180 and (ii) low contact resistance of SiN (or SiO, SiCN, etc.).

In some embodiments, the interface layer 122 may have a first thickness and a second thickness. The first thickness of the interface layer 122 may be defined between the top surfaces of the first dies 110a-b and the bottom surface of the passive heat spreaders 121a-b, while the second thickness of the interface layer 122 may be defined between the bottom surface of the passive heat spreaders 121a-b and the top surface of the encapsulation layer 180 (e.g., the top surface of the dished/concaved portion of the encapsulation layer 180 disposed between one of the first dies 110a and another of the first dies 110a). In one embodiment, the first thickness of the interface layer 122 may be less than the second thickness of the interface layer 122 (e.g., the difference in thicknesses of the interface layer 122 may be due to dishing post grinding/polishing of the encapsulation layer 180). For one embodiment, the second thickness of the interface layer 122 may be approximately 2 um-3 um. In another embodiment, the second thickness of the interface layer 122 may be approximately or less than 3 um. In an embodiment, the first thickness of the interface layer 122 may be approximately or less than 2 um.

Additionally, in one embodiment, a plurality of second dies 111a-b may be disposed on the package substrate 102. The second dies 111a-b may be directly coupled to the top surface of the package substrate 102. In some embodiments, as shown in FIG. 1, the second dies 111a-b may be positioned adjacent to the outer edges of the respective substrates 130 and passive heat spreaders 121a-b. The second dies 111a-b may have a thickness that is greater than a thickness of the first dies 110a-b. For some embodiments, the second dies 111a-b may have a thickness that is substantially equal to a thickness of the combined thicknesses of the respective passive heat spreader 121a-b, the respective first dies 110a-b, and the respective substrates 130 with the conductive pads 118 and the solder balls/bumps 123. For example, the thickness of the stacked passive heat spreader 121a-b, the first dies 110a-b, and the substrates 130 may be approximately 100 um to 260 um or, in alternative example, may be approximately or less than 100 um. The thickness (or thicknesses) of the passive heat spreaders 121a-b may be manufactured based on the thicknesses of the first and second dies 110a-b and 111a-b (i.e., the approximate thickness of the passive heat spreaders 121a-b may be selected to match the differential thickness between the first dies 110a-b and the second dies 111a-b).

For one embodiment, the second die 111a may have a thickness that is substantially equal to a thickness of the second die 111b. As such, in these embodiments, the top surfaces of the second dies 111a-b may be substantially coplanar to the top surfaces of the passive heat spreaders 121a-b. For one embodiment, the second dies 111a-b may be a satellite die, a high-bandwidth memory (HBM) die, and/or any other die or electrical device/component with a thickness that may be greater than the thickness of the first dies 110a-b. Furthermore, in some embodiments, the second dies 110a-b may include, but are not limited to, a semiconductor die, an electronic device (e.g., a wireless device), an IC, a CPU, a microprocessor, a PCH, a memory (e.g., a HBM die), and/or a FPGA. The second dies 111a-b may be formed from a material such as silicon (or the like) and have circuitry thereon that is to be coupled onto the package substrate 102.

In some embodiments, a TIM 140 may be disposed over the second dies 111a-b, the passive heat spreaders 121a-b, and the package substrate 102. The TIM 140 may be directly coupled onto the top surfaces of the second dies 111a-b and the passive heat spreaders 121a-b. In another embodiment, the passive heat spreaders 121a-b may be coupled onto the TIM 140 with a backside metallization (BSM) layer or the like. In one embodiment, the TIM 140 may be a STIM such as an iridium STIM or the like. In other embodiments, the TIM 140 may include one or more highly thermal conductivity materials. For example, the TIM 140 may be a metallic TIM, a STIM, a polymer TIM (PTIM), and/or any similar highly thermal conductive material(s). Note that, while one TIM 140 is shown in FIG. 1, it is to be appreciated that any number of TIMs 140 may be disposed on/over and coupled onto the second dies 111a-b and the passive heat spreaders 121a-b. For example, one TIM 140 may be disposed only over the second die 111a and the passive heat spreader 121a, while another, separate TIM 140 may be disposed over the second die 111b and the passive heat spreader 121b, where the two TIMs 140 may have the same thickness or different thicknesses.

In one embodiment, a heat spreader 120 may be disposed over the TIM 140, the passive heat spreaders 121a-b, the first and second dies 110a-b and 111a-b, the substrates 130, and the package substrate 102. The heat spreader 120 may be manufactured (or shaped) to include a lid and a plurality of legs (or pedestals), where the lid of the heat spreader 120 may be directly disposed on the top surface of the TIM 140, and the legs of the heat spreader 120 may be directly disposed on the top surface of the package substrate 102. In some embodiments, the heat spreader 120 may be a heatsink, an IHS, a heat exchanger, a manifold, a cold plate, and/or any similar thermal solution (or device) that may be used to help transfer the heat from the electrical components of the semiconductor package 100 to the ambient environment (or an additional heat spreader).

For one embodiment, the heat spreader 120 may enclose (or form) a cavity 115 that surrounds the TIM 140, the passive heat spreaders 121a-b, the first and second dies 110a-b and 111a-b, and the substrates 130. In an embodiment, an underfill material 154 may be disposed within the cavity 115 of the heat spreader 120 and on the top surface of the package substrate 102, where the underfill material 154 may partially/fully surround the second dies 111a-b, the passive heat spreaders 121a-b, the encapsulation layer 180, and the substrates 130 with the conductive pads 118 and the solder balls 123. The underfill 154 may be substantially similar to the underfill material 155.

Note that the semiconductor package 100 of FIG. 1 may include fewer or additional packaging components based on the desired packaging design.

FIGS. 2A-2H are illustrations of cross-sectional views of a process flow to form a semiconductor package 200, in accordance with an embodiment. The process flow illustrated in FIGS. 2A-2H forms the semiconductor package 200 that is substantially similar to the semiconductor package 100 described above in FIG. 1. Likewise, the components of the semiconductor package 200 are substantially similar to the components of the semiconductor package 100 described above in FIG. 1. Accordingly, the process flow of the semiconductor package 200 illustrates one of the approaches to couple a passive heat spreader 221 over a plurality of dies 210a-b, thereby improving the MCP thermal and mechanical properties of the semiconductor package 200 by (i) controlling the thickness of the passive heat spreader 221 to provide a single thermal solution, (ii) minimizing the interface/impact of an encapsulation layer 280 with a thermal solution such a heat spreader (or the like) to improve the overall thermal efficiency, and (iii) leveraging the material(s) of the passive heat spreader 221 (e.g., a Si material, a SiC material, or the like) to have substantially similar CTE material(s) as the dies 210a-b to enable a reduced (or minimal) warpage, in accordance with some embodiments. Accordingly, the process flow of FIGS. 2A-2H described below allows the semiconductor package 200 to integrate and stack the dies 210a-b and the passive heat spreader 221, at wafer level, so that the same/single thermal solution may be implemented for the entire MCP with unique TIMs, such as STIM, to substantially increase the IC performance of the semiconductor package 200, while also eliminating all needs for temporary carriers (e.g., thermoplastic, thermoset, etc.) and avoiding any mechanical problems associated with such carriers.

Figure 2A:
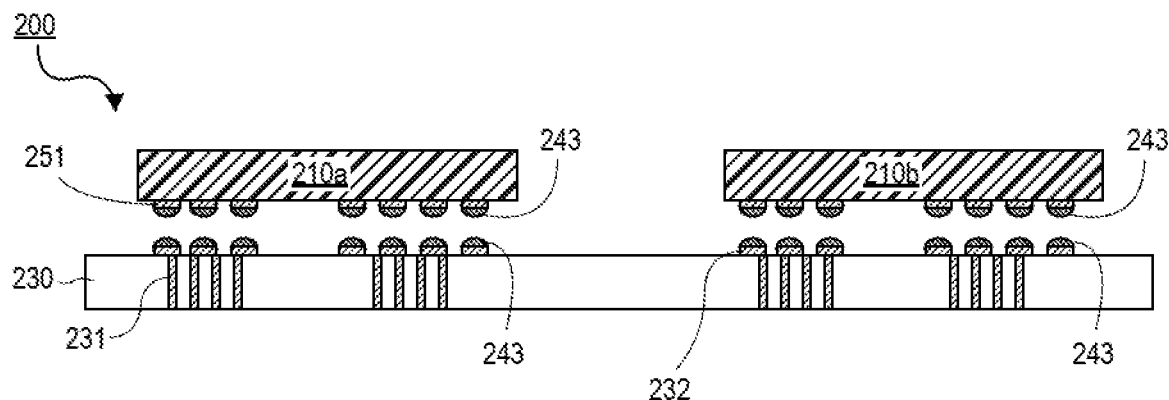
FIGS. 2A-2H are illustrations of cross-sectional views of a process flow to form a semiconductor package with a heat spreader, a TIM, a plurality of first dies, a plurality of second dies, a plurality of substrates, and a package substrate, according to some embodiments.

Referring now to FIG. 2A, a cross-sectional illustration of a semiconductor package 200 is shown at a wafer level, in accordance with an embodiment. In an embodiment, a plurality of dies 210a-b may be disposed on a substrate 230. In one embodiment, the substrate 230 may be a wafer substrate. The die 210a may be positioned adjacent to the die 210b with a slight gap in between the dies 210a-b. The dies 210a-b and the substrate 230 may be substantially similar to the first dies 110a-b and the substrate 130 described above in FIG. 1. The substrate 230 may include a plurality of conductive interconnects 231, a plurality of conductive pads 232, and a plurality of solder balls 243. The dies 210a-b may include a plurality of conductive pads 251 and a plurality of solder balls 243. Accordingly, in one embodiment, the semiconductor package 200 may implement a thermal compression bonding (TCB) (or the like) to conductively couple the dies 210a-b onto the substrate 230.

Figure 2B:
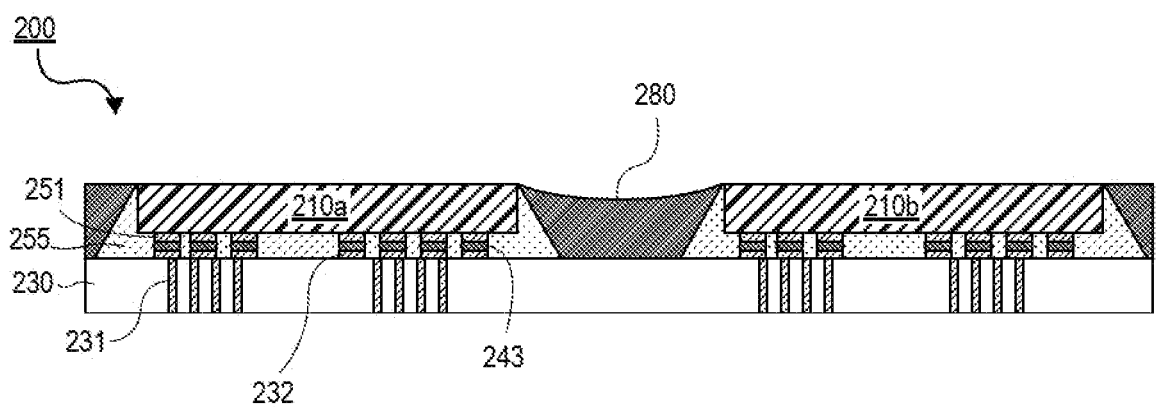

Referring now to FIG. 2B, a cross-sectional illustration of a semiconductor package 200 is shown, in accordance with an embodiment. In an embodiment, after the TCB, an underfill material 255 (or a capillary underfill (CUF) may be disposed on/over the dies 210a-b and the substrate 230, where the underfill material 255 may surround the conductive pads 232 and 251 and the solder balls 243 that are disposed between the bottom surfaces of the dies 210a-b and the top surface of the substrate 230. Furthermore, in one embodiment, an encapsulation layer 280 may be disposed on/over the dies 210a-b and the substrate 230, where the encapsulation layer 280 may surround the dies 210a-b and the underfill material 255.

As shown in FIG. 2B, the encapsulation layer 280 may fill the slight gap between the dies 210a-b. In an additional embodiment, the encapsulation layer 280 may be overfilled above/over the top surfaces of the dies 210a-b, as such the encapsulation layer 280 may be planarized with a CMP process (or the like) to expose the top surfaces of the dies 210a-b. Note that, after this CMP process, the top surfaces of the dies 210a-b may be positioned slightly above the top surface of the encapsulation layer 280 as the encapsulation layer 280 may have a slight encapsulation/mold dishing between the dies 210a-b. The underfill material 255 and the encapsulation layer 280 may be substantially similar to the underfill material 155 and the encapsulation layer 180 described above in FIG. 1.

Figure 2C:
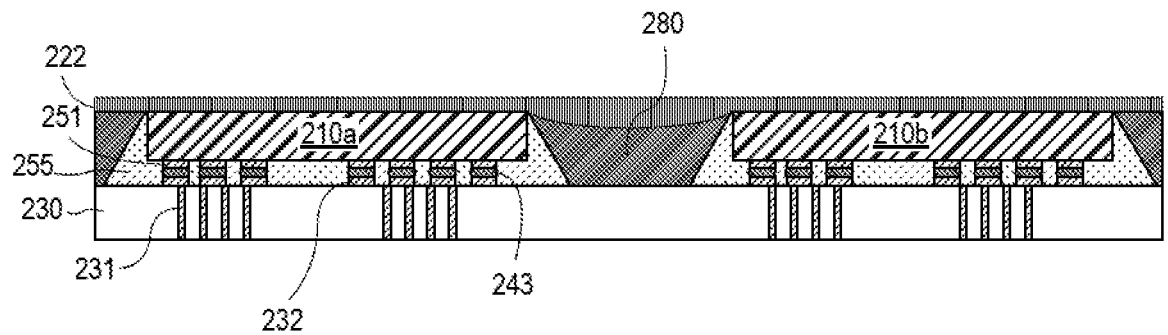

Referring now to FIG. 2C, a cross-sectional illustration of a semiconductor package 200 is shown, in accordance with an embodiment. In an embodiment, an interface layer 222 may be disposed over the dies 210a-b and the encapsulation layer 280, where the interface layer 222 may also fill in the slight encapsulation/mold dishing between the dies 210a-b. For one embodiment, the interface layer 222 may be directly coupled onto the exposed top surfaces of the dies 210a-b and the top surface of the encapsulation 280 with a physical vapor deposition (PVD), a chemical vapor deposition (CVD), or the like. In one embodiment, the interface layer 222 may include a SiN material, a SiO material, a SiCN material, a highly thermal conductive material, or the like. For example, the interface layer 222 may be a SiN/SiO/SiCN layer or a thermal adhesive layer. The interface layer 222 may be substantially similar to the interface layer 122 described above in FIG. 1.

Figure 2D:
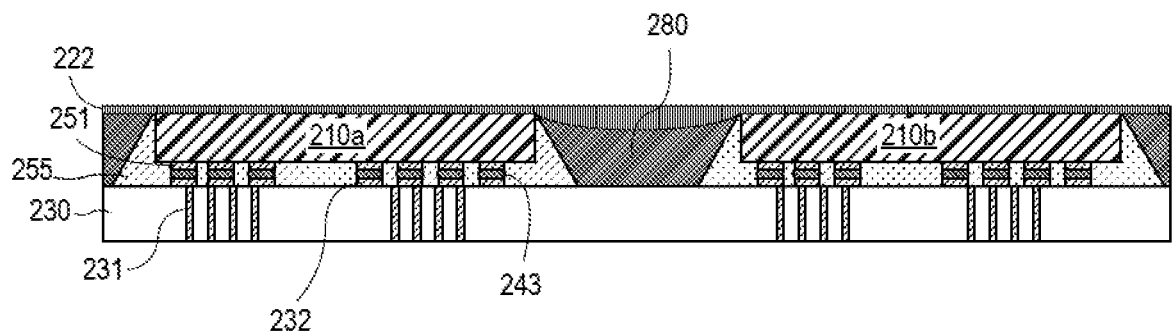

Referring now to FIG. 2D, a cross-sectional illustration of a semiconductor package 200 is shown, in accordance with an embodiment. In an embodiment, the semiconductor package 200 may implement a CMP process to substantially flatten the top surface of the interface layer 222, thereby substantially eliminating (or reducing) the encapsulation/mold dishing described above.

In these embodiments, at the wafer level, the surface preparation of the top surface of the stack wafer (i.e., the exposed top surfaces of the encapsulation layer 280 and dies 210a-b as shown in FIG. 2B) may importantly entail: (i) the deposition of SiN (or SiO/SiCN that may also be leveraged, but may provide a higher contact resistance) over the stack wafer surface (i.e., the SiN (or SiO, SiCN, etc.) deposition of the interface layer 222 over the exposed encapsulation layer 280 and dies 210a-b as shown in FIG. 2C), and (ii) the grinding/polishing on the deposited SiN (or SiO/SiCN) to ensure the flatness of the stack wafer surface (i.e., the interface layer 222 is substantially flattened with the CMP process as shown in FIG. 2D). Furthermore, as described above, the SiN (or the SiO/SiCN) deposition may need to fill in (or overfill) the common dishing of the mold between the stack wafer dies, where such common dishing of the mold may be present at the Si interposer interface post mold grind (i.e., the thickness of the interface layer 222 positioned above the dished encapsulation layer 280 (and between the dies 210a-b) may be approximately 2 um to 3 um). As such, as described above and shown in FIG. 2D, the interface layer 222 may have a first thickness (defined as the thickness between the top surfaces of the interface layer 222 and the dies 210a-b) that is less than a second thickness (defined as the thickness between the top surface of the interface layer 222 and the bottommost surface/portion of the interface layer 222).

In another embodiment, the interface layer 222 may include a thermally conductive adhesive material. In these embodiments, the interface layer 222 may be a thermal adhesive layer such as a film or a dispensable liquid that may be implemented to attach the top surface of the stack wafer to a passive heat spreader interposer. For example, the thermal adhesive layer may be applied to the stack wafer or the interposer wafer, where the two wafers are subsequently bonded together. Note that, to meet the target/desired performance, the selection of a proper thermal adhesive layer (e.g., selecting the highly thermal adhesive materials of the interface layer 222 described above) is critical as is developing the proper processes for implementing the adhesive deposition and the bonding of the two wafers. Additionally, adequate thermal dissipation is required for sufficient bulk thermal conductivity and minimal interfacial thermal resistance. Also note that, to ensure good reliability performance, sufficient adhesive strength is required of the thermal adhesive layer to strongly bond the interposer and the stack wafers.

Figure 2E:
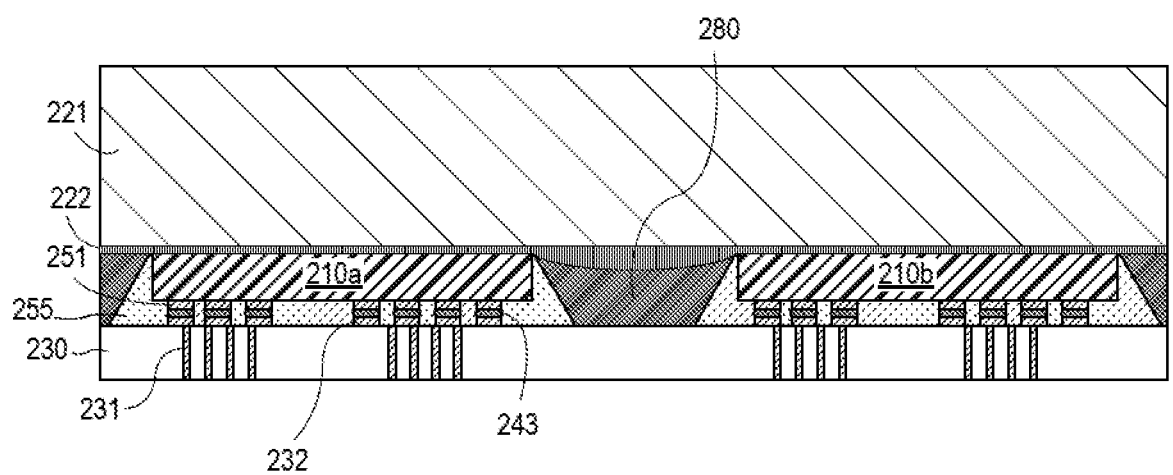

Referring now to FIG. 2E, a cross-sectional illustration of a semiconductor package 200 is shown, in accordance with an embodiment. In an embodiment, a passive heat spreader 221 may be disposed over the interface layer 222, the dies 210a-b, and the encapsulation layer 280. The passive heat spreader 221 may be conductively coupled onto the top surface of the interface layer 222. For example, the passive heat spreader 221 may be thermally/conductively coupled to the interface layer 222 implementing a SiN—SiN bonding, a SiO—SiO bonding, SiCN—SiCN bonding, and/or the like. In one embodiment the passive heat spreader 221 may have a width that is greater than the combined widths of the dies 210a-b. For one embodiment, the passive heat spreader 221 may be, but is not limited to, a passive heat spreader interposer, an interposer, a stiffener, and/or the like. For some embodiments, the passive heat spreader 221 may be formed of one or more different substrate/interposer materials, such as Si, SiC, or the like.

Figure 2F:
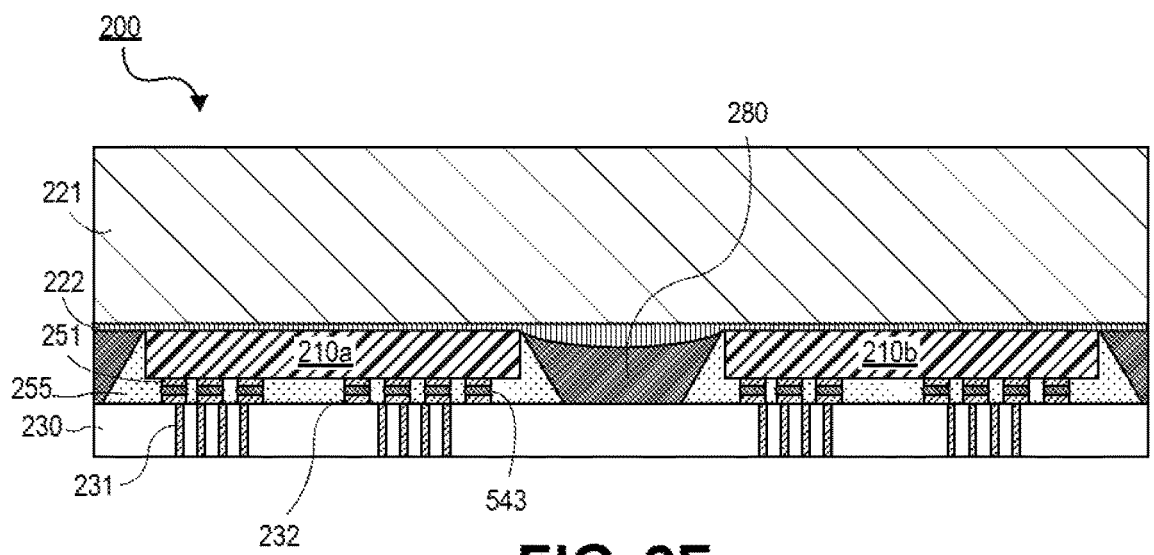

Referring now to FIG. 2F, a cross-sectional illustration of a semiconductor package 200 is shown, in accordance with an embodiment. In an embodiment, the passive heat spreader 221 may be permanently attached to the encapsulation layer 280 and the dies 210a-b by directly bonding the SiN/SiO/SiCN materials of the interface layer 222 to the Si/SiC materials of the passive heat spreader 221 with an annealing process (or the like). Furthermore, the annealing process may implement a low annealing temperature. The low annealing temperature may be leveraged for a plasma activation bond between the interface layer 222 and the passive heat spreader 221—without impacting the integrity of the semiconductor package 200.

Figure 2G:
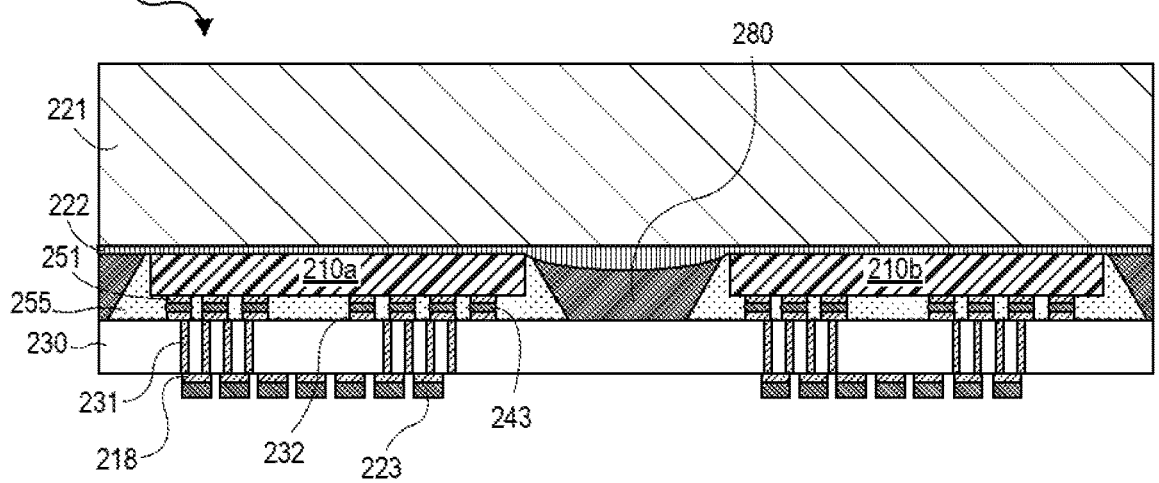

Referring now to FIG. 2G, a cross-sectional illustration of a semiconductor package 200 is shown, in accordance with an embodiment. In an embodiment, the semiconductor package 200 may implement a TSV reveal process (or the like) on the substrate 230 to expose the bottom surfaces of the conductive interconnects 231 (or the TSVs). Subsequently, in another embodiment, a plurality of conductive pads 218 may be disposed on the exposed conductive interconnects 231 of the substrates 230. The conductive pads 218 may be a plurality of ball-grid array (BGA) pads or the like. Additionally, a plurality of solder balls 223 may be conductively coupled to the conductive pads 218 of the substrate 230. As such, in additional embodiments, the substrate 230 may be coupled onto another substrate with the solder balls 223 (e.g., as shown with the substrate 130 coupled onto the package substrate 102 of FIG. 1).

Figure 2H:
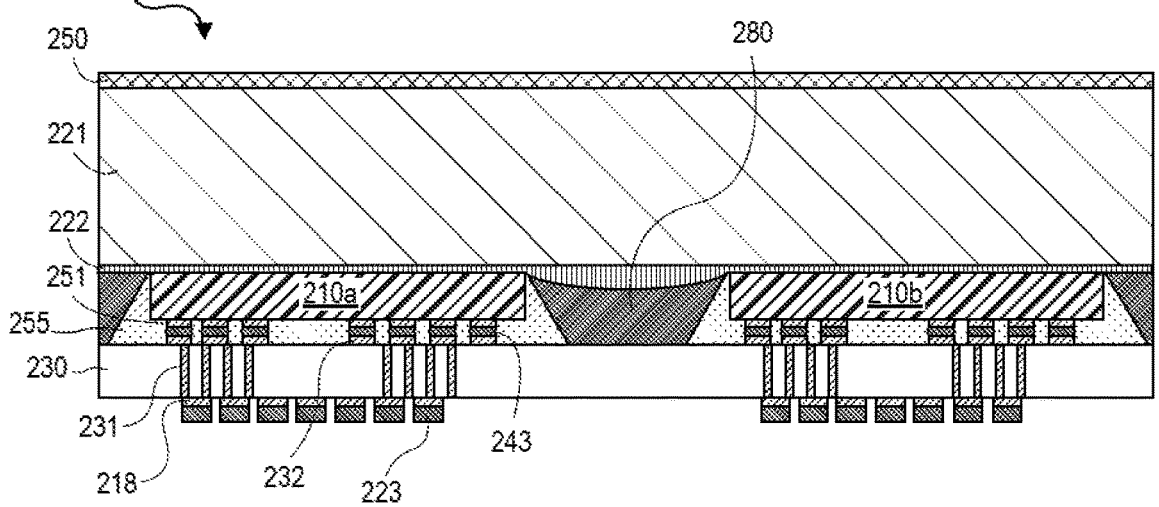

Referring now to FIG. 2H, a cross-sectional illustration of a semiconductor package 200 is shown, in accordance with an embodiment. In an embodiment, a BSM layer 250 may be disposed over the passive heat spreader 221. The BSM layer 250 may be conductive coupled onto the top surface of the passive heat spreader 221. In some embodiments, the BSM layer 250 may include one or more conductive materials, including, but are not limited to, titanium, nickel-vanadium, gold, silver, copper, and/or the like. For one embodiment, the BSM layer 250 may be coupled onto the passive heat spreader 221 with an adhesion promotion layer or the like.

Note that the semiconductor package 200 of FIGS. 2A-2H may include fewer or additional packaging components based on the desired packaging design.

Figure 3:
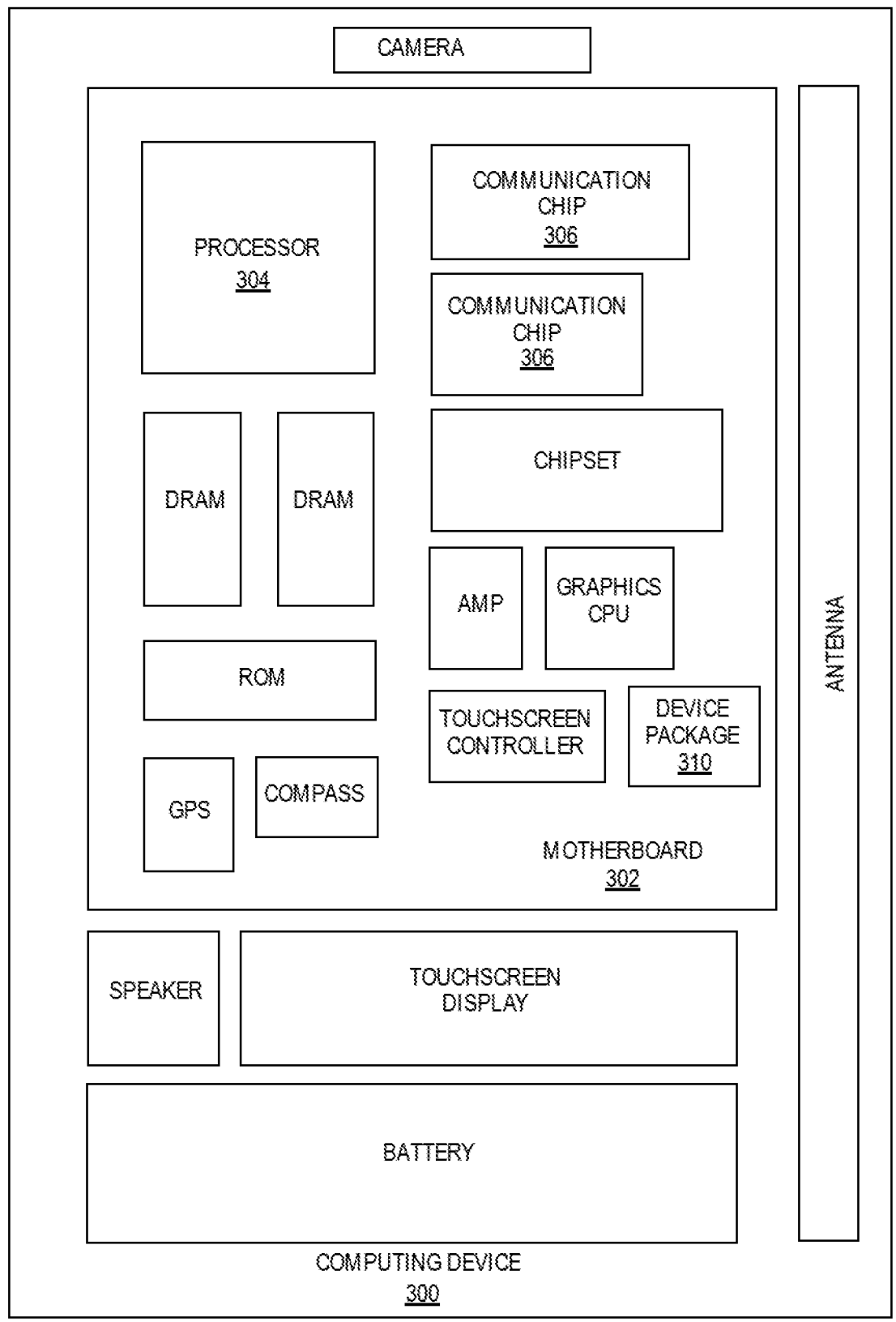
FIG. 3 is an illustration of a schematic block diagram illustrating a computer system that utilizes a semiconductor package with a heat spreader, a TIM, a plurality of first dies, a plurality of second dies, a plurality of substrates, and a package substrate, according to one embodiment.

FIG. 3 is an illustration of a schematic block diagram illustrating a computer system 300 that utilizes a device package 310 (or a semiconductor package) with a passive heat spreader, an interface layer, a TIM, a plurality of first and second dies, a substrate, and a package substrate, according to one embodiment. FIG. 3 illustrates an example of computing device 300. Computing device 300 houses a motherboard 302. Motherboard 302 may include a number of components, including but not limited to processor 304, device package 310 (or semiconductor package), and at least one communication chip 306. Processor 304 is physically and electrically coupled to motherboard 302. For some embodiments, at least one communication chip 306 is also physically and electrically coupled to motherboard 302. For other embodiments, at least one communication chip 306 is part of processor 304.

Depending on its applications, computing device 300 may include other components that may or may not be physically and electrically coupled to motherboard 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 306 enables wireless communications for the transfer of data to and from computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 306 may implement any of a number of wireless standards or protocols, including but not limited to Wi-Fi (IEEE 802.11 family), WiMAX (IEEE 802.112 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

Processor 304 of computing device 300 includes an integrated circuit die packaged within processor 304. Device package 310 may be a semiconductor package, a MCP package, or the like. Device package 310 may include, but is not limited to, a substrate, a package substrate, and/or a PCB. In one embodiment, device package 310 may include a semiconductor package that may be substantially similar to the semiconductor packages 100 and 200 of FIGS. 1 and 2A-2H described herein. Device package 310 may include integrating passive heat spreaders on/over stacked dies with interfaces layers as described herein (e.g., as illustrated and described above with the passive heat spreaders 121 and 221 of FIGS. 1-2A-2H)—or any other components from the figures described herein.

Note that device package 310 may be a single component/device, a subset of components, and/or an entire system, as the materials, features, and components may be limited to device package 310 and/or any other component of the computing device 300 that may need the passive heat spreaders as described herein (e.g., the motherboard 302, the processor 304, and/or any other component of the computing device 300 that may need the embodiments of the semiconductor packages as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 306 also includes an integrated circuit die packaged within the communication chip 306. For some embodiments, the integrated circuit die of the communication chip 306 may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a semiconductor package, comprising: a plurality of first dies on a substrate; an encapsulation layer over the plurality of first dies and the substrate; an interface layer over the plurality of first dies and the encapsulation layer; and a passive heat spreader on the interface layer, wherein the interface layer thermally couples the plurality of first dies to the passive heat spreader.

In example 2, the subject matter of example 1 can optionally include that the passive heat spreader includes a Si or a SiC.

In example 3, the subject matter of examples 1-2 can optionally include that the interface layer includes a SiN material, a SiO material, a SiCN material, or a thermal adhesive material.

In example 4, the subject matter of examples 1-3 can optionally include that the interface layer has a third thickness and a fourth thickness, and wherein the third thickness of the interface layer is less than the fourth thickness of the interface layer.

In example 5, the subject matter of examples 1-4 can optionally include that the substrate includes a plurality of TSVs.

In example 6, the subject matter of examples 1-5 can optionally include a plurality of second dies on a package substrate, wherein the substrate is on the package substrate, wherein the plurality of second dies have top surfaces that are substantially coplanar to a top surface of the passive heat spreader, wherein the plurality of second dies are adjacent to outer edges of the passive heat spreader and the substrate, and wherein the plurality of TSVs of the substrate conductively couple the plurality of first dies to the package substrate; a TIM over the plurality of second dies, the passive heat spreader, and the package substrate, wherein the TIM has a thickness above the plurality of second dies that is substantially equal to a thickness of the TIM above the passive heat spreader, wherein the TIM has a bottom surface that is directly on the top surfaces of the plurality of second dies and the passive heat spreader, and wherein the bottom surface of the TIM is substantially coplanar to the top surfaces of the plurality of second dies and the top surface of the passive heat spreader; a heat spreader over the TIM and the package substrate, wherein the heat spreader includes a lid and a plurality of legs, wherein the lid of the heat spreader is directly on a top surface of the TIM, and wherein the plurality of legs of the heat spreader are directly on a top surface of the package substrate; and an underfill material on the top surface of the package substrate, wherein the underfill material surrounds portions of the plurality of second dies, the encapsulation layer, and the substrate.

In example 7, the subject matter of examples 1-6 can optionally include that the plurality of first dies has a first thickness that is less than a second thickness of the plurality of second dies, wherein the passive heat spreader has a thickness that is greater than the first thickness of the plurality of first dies, wherein the second thickness of the plurality of second dies is substantially equal to a combined thickness of the passive heat spreader, the plurality of first dies, and the substrate, wherein the TIM has a single monolithic thickness, and wherein the lid of the heat spreader has a single monolithic thickness.

In example 8, the subject matter of examples 1-7 can optionally include that the plurality of second dies include a HBM die.

In example 9, the subject matter of examples 1-8 can optionally include that the TIM is a STIM, and wherein the passive heat spreader is coupled to the TIM with a BSM layer.

Example 10 is a method to form a semiconductor package, comprising: disposing a plurality of first dies on a substrate; disposing an encapsulation layer over the plurality of first dies and the substrate; disposing an interface layer over the plurality of first dies and the encapsulation layer; and disposing a passive heat spreader on the interface layer, wherein the interface layer thermally couples the plurality of first dies to the passive heat spreader.

In example 11, the subject matter of example 10 can optionally include that the passive heat spreader includes a Si or a SiC.

In example 12, the subject matter of examples 10-11 can optionally include that the interface layer includes a SiN material, a SiO material, a SiCN material, or a thermal adhesive material.

In example 13, the subject matter of examples 10-12 can optionally include that the interface layer has a third thickness and a fourth thickness, and wherein the third thickness of the interface layer is less than the fourth thickness of the interface layer.

In example 14, the subject matter of examples 10-13 can optionally include that the substrate includes a plurality of TSVs.

In example 15, the subject matter of examples 10-14 can optionally include etching the substrate to expose bottom surfaces of the plurality of TSVs; disposing a BSM layer over a top surface of the passive heat spreader; disposing a plurality of second dies and the substrate on a package substrate, wherein the plurality of second dies have top surfaces that are substantially coplanar to the top surface of the passive heat spreader, wherein the plurality of second dies are adjacent to outer edges of the passive heat spreader and the substrate, and wherein the exposed plurality of TSVs of the substrate conductively couple the plurality of first dies to the package substrate; disposing a TIM over the plurality of second dies, the passive heat spreader, and the package substrate, wherein the TIM has a thickness above the plurality of second dies that is substantially equal to a thickness of the TIM above the passive heat spreader, wherein the TIM has a bottom surface that is directly on the top surfaces of the plurality of second dies and the passive heat spreader, and wherein the bottom surface of the TIM is substantially coplanar to the top surfaces of the plurality of second dies and the top surface of the passive heat spreader; disposing an underfill material on the top surface of the package substrate, wherein the underfill material surrounds portions of the plurality of second dies, the encapsulation layer, and the substrate; and disposing a heat spreader over the TIM and the package substrate, wherein the heat spreader includes a lid and a plurality of legs, wherein the lid of the heat spreader is directly on a top surface of the TIM, and wherein the plurality of legs of the heat spreader are directly on a top surface of the package substrate.

In example 16, the subject matter of examples 10-15 can optionally include that the plurality of first dies has a first thickness that is less than a second thickness of the plurality of second dies, wherein the passive heat spreader has a thickness that is greater than the first thickness of the plurality of first dies, wherein the second thickness of the plurality of second dies is substantially equal to a combined thickness of the passive heat spreader, the plurality of first dies, and the substrate, wherein the TIM has a single monolithic thickness, and wherein the lid of the heat spreader has a single monolithic thickness.

In example 17, the subject matter of examples 10-16 can optionally include that the plurality of second dies include a HBM die.

In example 18, the subject matter of examples 10-17 can optionally include that the TIM is a STIM, and wherein the passive heat spreader is coupled to the TIM with a BSM layer.

Example 19 is a semiconductor package, comprising: a plurality of substrates on a package substrate; a plurality of first dies on the plurality of substrates; a plurality of second dies on the package substrate; an encapsulation layer over the plurality of first dies and the plurality of substrates; a plurality of interface layers over the plurality of first dies and the encapsulation layer; a plurality of passive heat spreaders on the plurality of interface layers, wherein the plurality of interface layers thermally couples the respective plurality of first dies to the respective to plurality of passive heat spreaders, wherein the plurality of second dies are adjacent to outer edges of the plurality of passive heat spreaders and the plurality of substrates, and wherein the plurality of second dies have top surfaces that are substantially coplanar to top surfaces of the plurality of passive heat spreaders; a TIM over the plurality of second dies, the plurality of passive heat spreaders, and the package substrate; and a heat spreader over the TIM and the package substrate.

In example 20, the subject matter of example 19 can optionally include that the passive heat spreader includes a Si or a SiC, and wherein the interface layer includes a SiN material, a SiO material, a SiCN material, or a thermal adhesive material.

In example 21, the subject matter of examples 19-20 can optionally include that the interface layer has a third thickness and a fourth thickness, and wherein the third thickness of the interface layer is less than the fourth thickness of the interface layer.

In example 22, the subject matter of examples 19-21 can optionally include that the plurality of substrates include a plurality of TSVs, and wherein the plurality of TSVs of the plurality of substrates conductively couple the plurality of first dies to the package substrate.

In example 23, the subject matter of examples 19-22 can optionally include an underfill material on a top surface of the package substrate, wherein the underfill material surrounds portions of the plurality of second dies, the encapsulation layer, and the plurality of substrates, wherein the TIM has a thickness above the plurality of second dies that is substantially equal to a thickness of the TIM above the plurality of passive heat spreaders, wherein the TIM has a bottom surface that is directly on the top surfaces of the plurality of second dies and the plurality of passive heat spreaders, and wherein the bottom surface of the TIM is substantially coplanar to the top surfaces of the plurality of second dies and the top surfaces of the plurality of passive heat spreaders, wherein the heat spreader includes a lid and a plurality of legs, wherein the lid of the heat spreader is directly on a top surface of the TIM, and wherein the plurality of legs of the heat spreader are directly on the top surface of the package substrate.

In example 24, the subject matter of examples 19-23 can optionally include that the plurality of first dies have a first thickness that is less than a second thickness of the plurality of second dies, wherein the plurality of passive heat spreaders have a thickness that is greater than the first thickness of the plurality of first dies, wherein the second thickness of the plurality of second dies is substantially equal to a combined thickness of the plurality of passive heat spreaders, the plurality of first dies, and the plurality of substrates, wherein the TIM has a single monolithic thickness, and wherein the lid of the heat spreader has a single monolithic thickness.

In example 25, the subject matter of examples 19-24 can optionally include that the plurality of second dies include a HBM die, wherein the TIM is a STIM, and wherein the plurality of passive heat spreaders are coupled to the TIM with a plurality of BSM layers.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A semiconductor package, comprising:
    a plurality of first dies on a substrate;
    an encapsulation layer over the substrate, wherein the encapsulation layer surrounds the plurality of first dies;
    an interface layer over the plurality of first dies and the encapsulation layer, wherein the interface layer has a portion with a bottom having a curved surface; and
    a passive heat spreader on the interface layer, wherein the interface layer thermally couples the plurality of first dies to the passive heat spreader.

2. The semiconductor package of claim 1, wherein the passive heat spreader includes a silicon (Si) material or a silicon carbide (SiC) material.

3. The semiconductor package of claim 1, wherein the interface layer includes a silicon nitride (SiN) material, a silicon monoxide (SiO) material, a silicon carbon nitride (SiCN) material, or a thermal adhesive material.

4. The semiconductor package of claim 1, wherein the interface layer has a first thickness and a second thickness, wherein the first thickness of the interface layer is less than the second thickness of the interface layer.

5. The semiconductor package of claim 1, wherein the substrate includes a plurality of through silicon vias (TSVs).

6. The semiconductor package of claim 5, further comprising:
    a plurality of second dies on a package substrate, wherein the substrate is on the package substrate, wherein the plurality of second dies have top surfaces that are substantially coplanar to a top surface of the passive heat spreader, wherein the plurality of second dies are adjacent to outer edges of the passive heat spreader and the substrate, and wherein the plurality of TSVs of the substrate conductively couple the plurality of first dies to the package substrate;
    a thermal interface material (TIM) over the plurality of second dies, the passive heat spreader, and the package substrate, wherein the TIM has a thickness above the plurality of second dies that is substantially equal to a thickness of the TIM above the passive heat spreader, wherein the TIM has a bottom surface that is directly on the top surfaces of the plurality of second dies and the passive heat spreader, and wherein the bottom surface of the TIM is substantially coplanar to the top surfaces of the plurality of second dies and the top surface of the passive heat spreader;
    a heat spreader over the TIM and the package substrate, wherein the heat spreader includes a lid and a plurality of legs, wherein the lid of the heat spreader is directly on a top surface of the TIM, and wherein the plurality of legs of the heat spreader are directly on a top surface of the package substrate; and
    an underfill material on the top surface of the package substrate, wherein the underfill material surrounds portions of the plurality of second dies, the encapsulation layer, and the substrate.

7. The semiconductor package of claim 6, wherein the plurality of first dies has a first thickness that is less than a second thickness of the plurality of second dies, wherein the passive heat spreader has a thickness that is greater than the first thickness of the plurality of first dies, wherein the second thickness of the plurality of second dies is substantially equal to a combined thickness of the passive heat spreader, the plurality of first dies, and the substrate, wherein the TIM has a single monolithic thickness, and wherein the lid of the heat spreader has a single monolithic thickness.

8. The semiconductor package of claim 6, wherein the plurality of second dies include a high-bandwidth memory (HBM) die.

9. The semiconductor package of claim 6, wherein the TIM is a solder TIM (STIM), and wherein the passive heat spreader is coupled to the TIM with a backside metallization (BSM) layer.

10. A semiconductor package, comprising:
a plurality of substrates on a package substrate;
a plurality of first dies on the plurality of substrates;
a plurality of second dies on the package substrate;
an encapsulation layer over the plurality of substrates, wherein the encapsulation layer surrounds the plurality of first dies;
a plurality of interface layers over the plurality of first dies and the encapsulation layer;
a plurality of passive heat spreaders on the plurality of interface layers, wherein the plurality of interface layers thermally couples the respective plurality of first dies to the respective to plurality of passive heat spreaders, wherein the plurality of second dies are adjacent to outer edges of the plurality of passive heat spreaders and the plurality of substrates, and wherein the plurality of second dies have top surfaces that are substantially coplanar to top surfaces of the plurality of passive heat spreaders;
a TIM over the plurality of second dies, the plurality of passive heat spreaders, and the package substrate; and
a heat spreader over the TIM and the package substrate.

11. The semiconductor package of claim 10, wherein the passive heat spreader includes a Si or a SiC, and wherein the interface layer includes a SiN material, a SiO material, a SiCN material, or a thermal adhesive material.

12. The semiconductor package of claim 11, wherein the interface layer has a third thickness and a fourth thickness, wherein the third thickness of the interface layer is less than the fourth thickness of the interface layer, wherein the interface layer has a bottom surface, and wherein the bottom surface of the interface layer has a portion with a curved surface.

13. The semiconductor package of claim 11, wherein the plurality of substrates include a plurality of TSVs, and wherein the plurality of TSVs of the plurality of substrates conductively couple the plurality of first dies to the package substrate.

14. The semiconductor package of claim 10, further comprising an underfill material on a top surface of the package substrate, wherein the underfill material surrounds portions of the plurality of second dies, the encapsulation layer, and the plurality of substrates, wherein the TIM has a thickness above the plurality of second dies that is substantially equal to a thickness of the TIM above the plurality of passive heat spreaders, wherein the TIM has a bottom surface that is directly on the top surfaces of the plurality of second dies and the plurality of passive heat spreaders, and wherein the bottom surface of the TIM is substantially coplanar to the top surfaces of the plurality of second dies and the top surfaces of the plurality of passive heat spreaders, wherein the heat spreader includes a lid and a plurality of legs, wherein the lid of the heat spreader is directly on a top surface of the TIM, and wherein the plurality of legs of the heat spreader are directly on the top surface of the package substrate.

15. The semiconductor package of claim 14, wherein the plurality of first dies have a first thickness that is less than a second thickness of the plurality of second dies, wherein the plurality of passive heat spreaders have a thickness that is greater than the first thickness of the plurality of first dies, wherein the second thickness of the plurality of second dies is substantially equal to a combined thickness of the plurality of passive heat spreaders, the plurality of first dies, and the plurality of substrates, wherein the TIM has a single monolithic thickness, and wherein the lid of the heat spreader has a single monolithic thickness.

16. The semiconductor package of claim 14, wherein the plurality of second dies include a HBM die, wherein the TIM is a STIM, and wherein the plurality of passive heat spreaders are coupled to the TIM with a plurality of BSM layers.

17. A semiconductor package, comprising: a plurality of first dies on a substrate, wherein the substrate includes a plurality of through silicon vias (TSVs); an encapsulation layer over the substrate, wherein the encapsulation layer surrounds the plurality of first dies; an interface layer over the plurality of first dies and the encapsulation layer; a passive heat spreader on the interface layer, wherein the interface layer thermally couples the plurality of first dies to the passive heat spreader(.) ; a plurality of second dies on a package substrate, wherein the substrate is on the package substrate, wherein the plurality of second dies have top surfaces that are substantially coplanar to a top surface of the passive heat spreader, wherein the plurality of second dies are adjacent to outer edges of the passive heat spreader and the substrate, and wherein the plurality of TSVs of the substrate conductively couple the plurality of first dies to the package substrate; a thermal interface material (TIM) over the plurality of second dies, the passive heat spreader, and the package substrate, wherein the TIM has a thickness above the plurality of second dies that is substantially equal to a thickness of the TIM above the passive heat spreader, wherein the TIM has a bottom surface that is directly on the top surfaces of the plurality of second dies and the passive heat spreader, and wherein the bottom surface of the TIM is substantially coplanar to the top surfaces of the plurality of second dies and the top surface of the passive heat spreader; a heat spreader over the TIM and the package substrate, wherein the heat spreader includes a lid and a plurality of legs, wherein the lid of the heat spreader is directly on a top surface of the TIM, and wherein the plurality of legs of the heat spreader are directly on a top surface of the package substrate; and an underfill material on the top surface of the package substrate, wherein the underfill material surrounds portions of the plurality of second dies, the encapsulation layer, and the substrate.

18. The semiconductor package of claim 17, wherein the plurality of first dies has a first thickness that is less than a second thickness of the plurality of second dies, wherein the passive heat spreader has a thickness that is greater than the first thickness of the plurality of first dies, wherein the second thickness of the plurality of second dies is substantially equal to a combined thickness of the passive heat spreader, the plurality of first dies, and the substrate, wherein the TIM has a single monolithic thickness, and wherein the lid of the heat spreader has a single monolithic thickness.

19. The semiconductor package of claim 17, wherein the plurality of second dies include a high-bandwidth memory (HBM) die.

20. The semiconductor package of claim 17, wherein the TIM is a solder TIM (STIM), and wherein the passive heat spreader is coupled to the TIM with a backside metallization (BSM) layer.

* * * * *